US008125358B2

(12) United States Patent
Hsieh et al.

(10) Patent No.: US 8,125,358 B2

(45) Date of Patent: Feb. 28, 2012

(54) METHOD FOR DECODING A MESSAGE

(75) Inventors: Chang-Ching Hsieh, Taipei Hsien (TW); Yeh-Shing Hoy, Taipei Hsien (TW)

(73) Assignee: Wistron Neweb Corp., Taipei Hsien (TW)

( * ) Notice: Subject to any disclaimer, the term of this patent is extended or adjusted under 35 U.S.C. 154(b) by 89 days.

(21) Appl. No.: 12/801,437

(22) Filed: Jun. 9, 2010

(65) Prior Publication Data

US 2011/0018746 A1 Jan. 27, 2011

(30) Foreign Application Priority Data

Jul. 23, 2009 (TW) ............................... 98124920 A

(51) Int. Cl.
*H03M 5/00* (2006.01)

(52) U.S. Cl. .......... 341/55; 709/219; 709/203; 709/223; 717/101; 717/120

(58) Field of Classification Search ............. 341/50–90; 709/223, 203, 219; 717/101, 120
See application file for complete search history.

(56) References Cited

U.S. PATENT DOCUMENTS 5,568,134 A * 10/1996 Cannon et al. ............... 340/7.54
6,845,237 B2 * 1/2005 Moulsley .................... 455/422.1
7,110,786 B2 * 9/2006 Moulsley et al. ............. 455/522
7,240,109 B2 * 7/2007 Wookey et al. ............... 709/223

* cited by examiner

*Primary Examiner* — Lam T Mai
(74) *Attorney, Agent, or Firm* — Bacon & Thomas, PLLC

(57) ABSTRACT

A method for decoding a message is disclosed. The method is used for an electronic system for displaying messages. The method comprises the following steps: a processing module decoding an un-decoded string of a message received from a message transferring terminal, acquiring a first word group and saving the first word group to a word group handling buffer, and recording a repetition value of the first word group; the processing module decoding an un-decoded string of a message received from the message transferring terminal, acquiring a second word group from the un-decoded string, and saving the second word group to a word group decoding buffer; the processing module comparing the first word group and the second word group to determine whether the first word group and the second word group are the same; and if yes, increasing the repetition value of the first word group.

16 Claims, 7 Drawing Sheets

| display | AB△△△△△△ | AB△△EF△△ | ABCDEF△△ | ABCDEFGH | AB34EFGH | . . . |
|---|---|---|---|---|---|---|
| P4 | | | | GH | | . . . |
| P3 | | EF | | | | . . . |
| P2 | | | CD | | 34 | . . . |
| P1 | AB | | | | | . . . |
| time | $t_1$ | $t_2$ | $t_3$ | $t_4$ | $t_5$ | $t_6$ |

Fig. 1

(Prior Art)

| display | ABCD | | | | 1234 | ... |
|---|---|---|---|---|---|---|
| P2 | | | 34 | | 34 | ... |
| P1 | AB | 12 | | 12 | | ... |
| time | T1 | T2 | T3 | T4 | T5 | T6 |

Fig. 4

| dispaly | | | ABCD | | | 1234 |
|---|---|---|---|---|---|---|
| P2 | | CD | | | 34 | |
| P1 | AB | | AB | 12 | | 12 |
| time | T1 | T2 | T3 | T4 | T5 | T6 |

Fig. 7

METHOD FOR DECODING A MESSAGE

BACKGROUND OF THE INVENTION

1. Field of the Invention

The present invention relates to a message decoding method and an electronic system thereof, and more particularly to a message decoding method and an electronic system thereof which uses a character-based switching technique and a buffer which uses a point accumulation technique.

2. Description of the Related Art

High Definition radio (HD radio) has been developed for several years and can be broadcast through the existing FM or AM radio channels. HD radio is different from the traditional FM and AM in that it is able to provide a high definition sound quality as well as a program service.

However, the message decoding algorithm used by the Digital Signal Processor (DSP) of the receiver for processing the HD radio received from the Radio Broadcast Data System (RBDS) produces considerable errors and causes the users to receive error text messages. The main cause of these erroneous messages is due to the low sampling rate of the DSP.

FIG. 1 is a table showing the decoded characters produced by a DSP with the relative position and time.

Take a word group of eight characters as an example. At each sampling, the DSP can only decode two characters with a corresponding position; the string will be updated and the word group will be shown on the display. For instance, assume that the broadcast system sends out two groups of words, which are ABCDEFGH and 12345678, respectively. As shown in FIG. 1, the first word group is received at time t1, with the first two characters decoded in the first position; then the first two characters appear on the display as D1="ABΔΔΔΔΔΔ" (Δ representing a blank space). At time t2, the DSP decodes another two characters of the first word group at position three; then the first word group appears on the display as D2="ABΔΔEFΔΔ". Due to the sampling rate of the DSP, a word group may be displayed before it is fully decoded; thus the word group shown on the display may be incomplete.

Next, the DSP decodes the characters at position two and position four at time t3 and t4, respectively. Then the display D4="ABCDEFGH" is the correct representation of the first word group transmitted by the broadcast system.

Next, the broadcast system sends out a second word group at t5, and the DSP decodes two characters at position two. However, there are no means to determine that these decoded characters are obtained from the second word group, which needs to be separated from the first word group; as a result, the characters previously obtained are replaced by the latest decoded characters at the corresponding position, and then the word group is shown directly on the display. Therefore, the display shows D3="AB34EFGH", which intermingles the first word group with the second word group and causes the user to receive an erroneous message.

In the prior art, this problem may be resolved by improving the hardware or the software. Hardware improvement can be done by enhancing the speed of the DSP to increase the sampling rate so that the characters of the word group can be completely obtained before it is displayed through a simple software algorithm. However, high speed DSP is expensive and consumes a considerable amount of electricity when placed into an embedded system and therefore is not a feasible solution.

On the other hand, software improvement can be done by comparing the word group whenever the word group is updated. This can be used to check for the consistency of the word group, and it can be used to identify whether the word group has been completely received, or whether a new message has been sent by the broadcast system. As a result, this may prevent intermingling of the word groups and improve the probability of displaying correct messages.

The present invention provides a method for decoding a message directed to improve the accuracy of a message decoding service.

SUMMARY OF THE INVENTION

The object of the present invention is to provide a method and an electronic system thereof, which is able to improve the accuracy of text message decoding service for a low sampling rate Radio Broadcast Data System (RBDS).

To achieve the above objective, an electronic system which adopts the said method for decoding a message comprises a processing module, a storage module, a receiving module, and a display device; wherein the processing module is separately connected to the storage module, the receiving module, and the display device electrically; wherein the receiving module is used for receiving an un-decoded string of a message from a message transferring terminal; the processing module decodes the un-decoded string; the display device is used for displaying the decoded text messages.

The method of decoding a message comprises the following steps of: the processing module decoding the un-decoded string of the message received from the message transferring terminal, acquiring a first word group and saving the first word group to a word group handling buffer of the storage module, and recording a repetition value of the first word group; the processing module decoding an un-decoded string of the message received from the message transferring terminal, acquiring a second word group from the un-decoded string and saving the second word group to a word group decoding buffer of the storage module; the processing module comparing the first word group and the second word group to determine whether the first word group and the second word group are the same; and increasing the repetition value of the first word group when the first word group and the second word group are the same. According to the repetition value, the accuracy of the decoded and compiled word group is determined, as is whether to show the word group on a display device.

In order to achieve the above mentioned object, the present invention provides another method of decoding a message comprising the following steps of: the processing module decoding an un-decoded string of a message received from the message transferring terminal, acquiring a plurality of characters and a plurality of position information corresponding to each of the characters, and saving the characters into the corresponding positions of a word group decoding buffer of the storage module; when the word group decoding buffer is full, the processing module determining whether the word group of the word group decoding buffer is the same as one of the word group of the word group handling buffer of the storage module; and increasing the repetition value of the first buffer word group when the processing module determines that the word group in the word group decoding buffer is the same as a the first buffer word group in the word group handling buffer; then using the repetition value to determine the accuracy of the decoded and compiled word group and subsequently determining whether to display the decoded and compiled word group onto a display device.

BRIEF DESCRIPTION OF THE DRAWINGS

FIG. 1 is a table showing the decoded characters produced by a DSP with the relative position and time of the prior art.

FIG. 4 is a table showing the time and output status of a DSP of an embodiment which uses the message decoding method of the present invention.

FIG. 7 is a table showing the time and output status of a DSP of an embodiment which uses the message decoding method of the present invention.

DETAILED DESCRIPTION OF THE PREFERRED EMBODIMENT

The advantages and innovative features of the invention will become more apparent from the following preferred embodiments.

Figure 2:
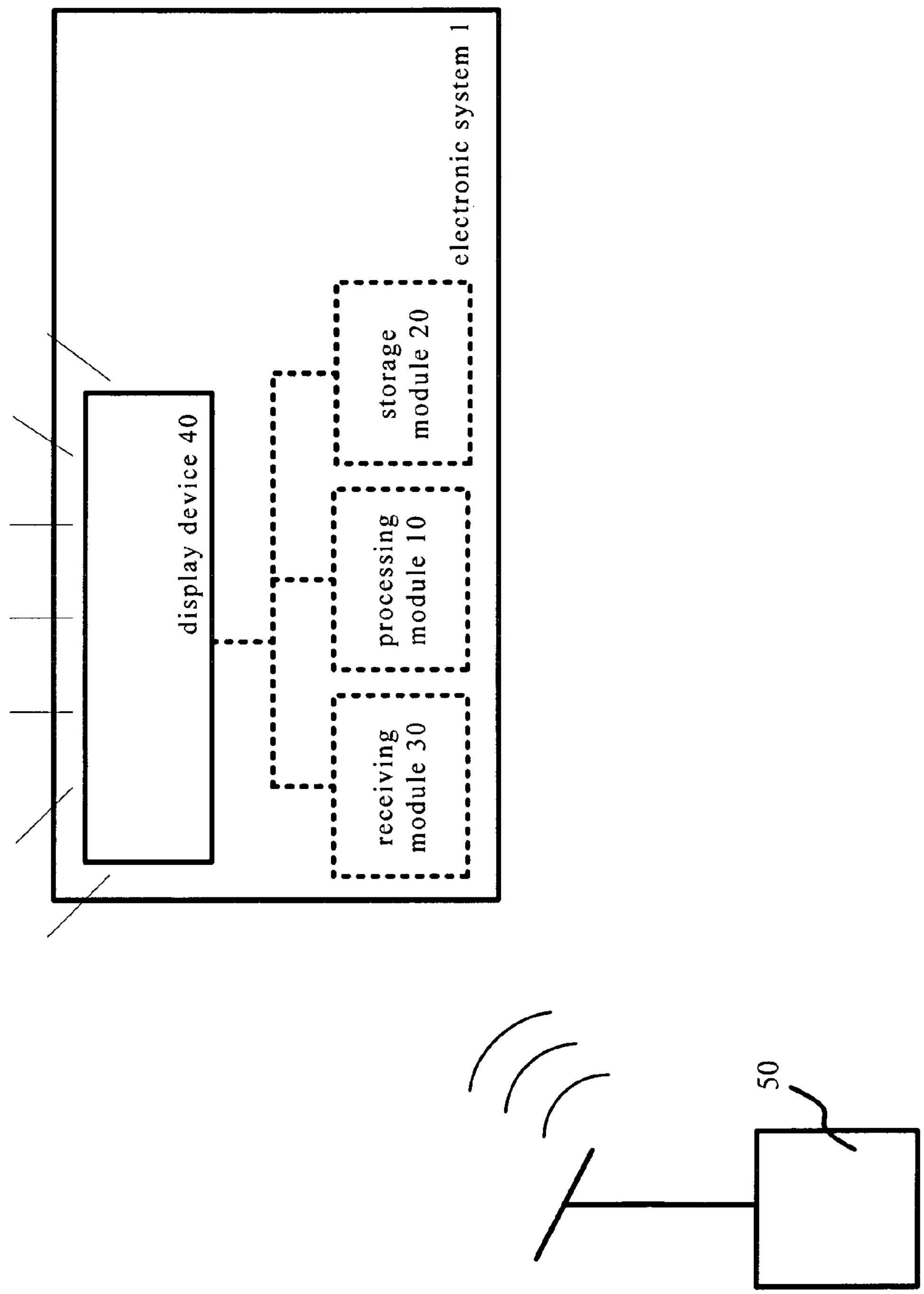
FIG. 2 is an embodiment showing an electronic system structure for the message decoding method of the present invention.

Refer to FIG. 2 through FIG. 7 for an embodiment showing the message decoding method of the present invention. Although an electronic system 1 is illustrated using a Radio Broadcast Data System (RBDS) as shown in FIG. 2, the message decoding method of the present invention is by no means limited to being used by the electronic system 1 only.

In the embodiment shown in FIG. 2, electronic system 1 of the present invention is illustrated using an RBDS, comprising a processing module 10, a storage module 20, a receiving module 30, and a display device 40; wherein the processing module 10 is separately connected to the storage module 20, the receiving module 30 and the display device 40 electrically; wherein the receiving module 30 is used for receiving an un-decoded string of a message from a message transferring terminal 50; the processing module 10 decodes the un-decoded string; the display device 40 is used for displaying text messages. The un-decoded string is formed by multiple characters; the storage module 20 comprises a word group decoding buffer, a first word group handling buffer, and a second word group handling buffer. The first word group handling buffer or the second word group handling buffer is used for saving a word group. Accuracy can be improved by implementing two buffer areas (the first word group handling buffer and the second word group handling buffer) into the storage module 20, and the buffer areas occupy only a small portion of the storage module 20. However, the storage module 20 is not only restricted to two buffer areas. In the present invention, the message decoding method may be conducted with one buffer area. Furthermore, the decoding speed and accuracy may be enhanced when multiple buffer areas are used.

In one embodiment, the electronic system 1 is a High Definition radio (HD radio); the message transferring terminal 50 is an HD radio broadcasting station; the processing module 10 is a Digital Signal Processor (DSP). But the present invention is not limited only to these devices.

The subsequent section describes the steps of the message decoding method for an embodiment.

Figure 3:
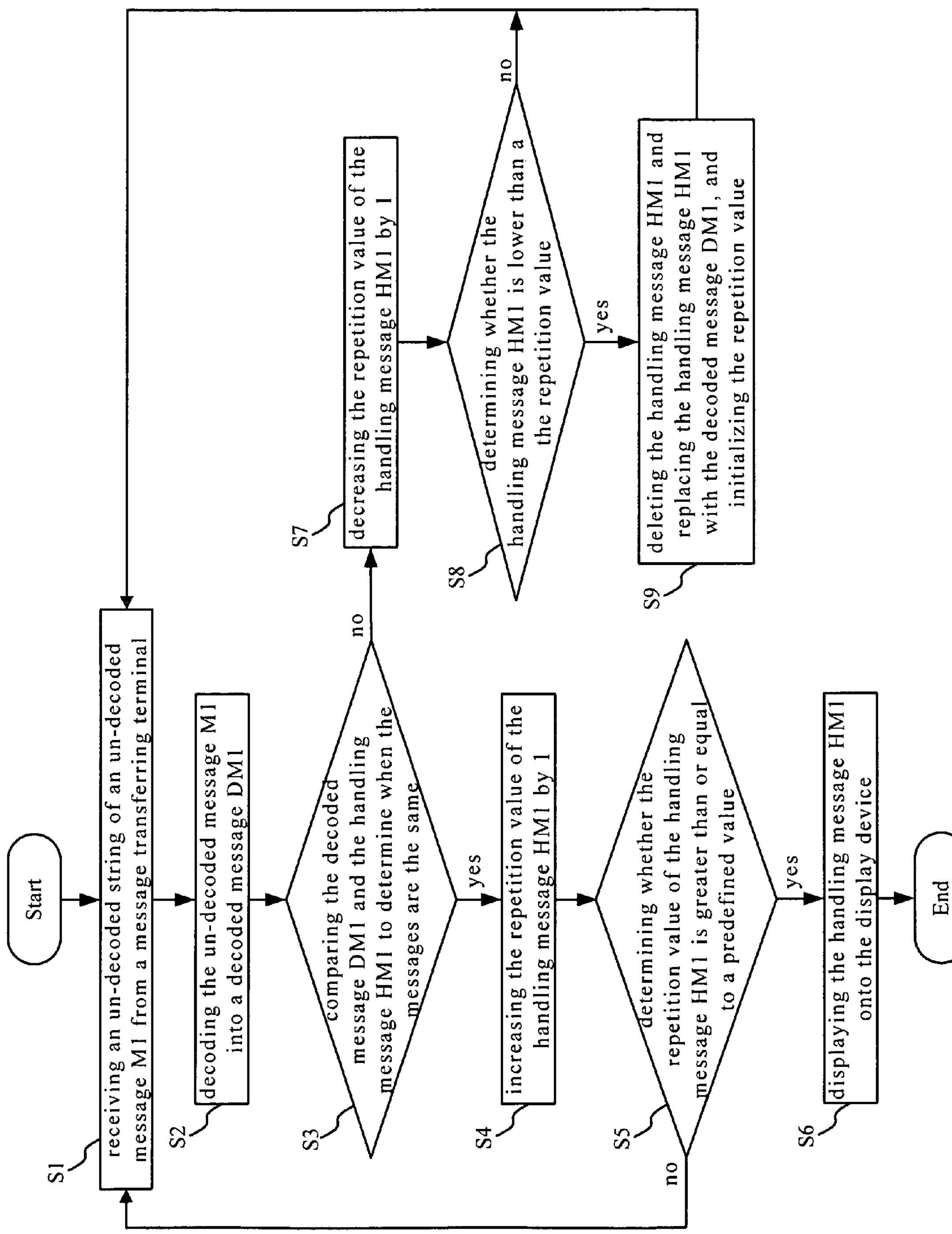
FIG. 3 is a flow chart showing the steps of the message decoding method for an embodiment of the present invention.

FIG. 3 shows the steps of the first embodiment for the present invention. During message handling process, the DSP has temporarily saved the decoded handling message HM1 in the storage module 20. The process begins with step S1: receiving an un-decoded string of an un-decoded message M1 from a message transferring terminal, then the process proceeds to step S2: decoding the un-decoded message M1 into a decoded message DM1; Step S3: comparing the decoded message DM1 and the handling message HM1 to determine whether the messages are the same, and if yes, then the process proceeds to step S4: increasing the repetition value of the handling message HM1 by 1, then the process proceeds to step S5: determining whether the repetition value of the handling message HM1 is greater than or equal to a predefined value. If no, the process then returns to step S1 to receive a message; and if yes, the process then proceeds to step S6: displaying the handling message HM1 onto the display device 40. The repetition value is used for determining the message consistency after a few messages have been received in order to decrease the probability of displaying an incorrect message. The predefined value can be set in conjunction with the sampling rate; increasing the predefined value will improve the accuracy of the message displayed, but it will also prolong the duration of the decoding process before the message is displayed.

Furthermore, during step S3, a determination that the decoded message DM1 and the handling message HM1 are not the same indicates that there may be an error in the handling message HM1; as a result, the process proceeds to step S7: decreasing the repetition value of the handling message HM1 by 1. In step S8, a determination that the repetition value of the handling message HM1 is lower than a threshold value suggests that the handling message HM1 is extremely incorrect, then the process proceeds to step S9: deleting the handling message HM1 and replacing the handling message HM1 with the decoded message DM1, and initializing the repetition value of the handling message as 1. Next, the process returns to step S1 to receive a message. If during step S8 it is determined that the repetition value of the handling message HM1 does not fall below a threshold value, then the process returns to step S1 to receive a message.

In another embodiment, when step S3 determines that the messages are not the same, it can proceed directly to step S9 to reduce the time spent on processing the incorrect messages.

FIG. 4 is a table showing the time and the status of the display device 40 in accordance with the steps in FIG. 3. In this example, each word group comprises four characters; after each sampling, the DSP is able to decode two characters with one corresponding position (therefore, there are only two positions in this embodiment); the string will be updated and the word group will be shown on the display. For instance, assume that the broadcast system sends out two groups of words, which are ABCD and 1234, respectively. In the decoding step S2, the DSP can decode only two characters with one corresponding position at each sampling, so at time T1, the characters AB are decoded at position one and the remaining positions are required to be filled with the characters from the previous handling message HM1. However, the handling message HM1 may be empty if the message is received for the first time; therefore, the programmer may specify a predefined value as the handling message HM1, or the handling message HM1 may acquire the value of the first decoded message. Experienced users in this field may decide the initial settings for the handling message HM1. In the present embodiment, assume that HM1 is preassigned a value in order to simplify the description. Assume, for example, that the decoding step S2 has already been executed and the message ABCD has been obtained, such that the handling message HM1=ABCD and the repetition value=1; therefore, step S2 yields the decoded message as DM1=ABCD. After proceeding to step S3, the repetition value of the handling message HM1 is increased to 2. At this point, the handling message is ready to be displayed if the programmer presets the predefined value as 2. After the decision process of step S5, the process then proceeds to step S6 and shows the message on the display device 40.

At time T2, the message is received and decoded, resulting in DM1=12CD; step S3 then determines that DM1 and HM1 are not the same, and then proceeds to step S7, reducing the repetition value of the handling message HM1 by 1, so that the repetition value=1. The process then proceeds to step S8, which determines whether the repetition value is lower than the threshold. If the programmer sets the threshold as 1, then the repetition value is not lower than the threshold, and the process returns to step S1 to receive a message; as a result, no new message is shown on the display device 40.

At time T3, the message is received and decoded, resulting in DM1=AB34; then step S3 determines that DM1 and HM1 are not the same and proceeds to step S7, in which the repetition value of the handling message HM1 is reduced by 1. At this point, the repetition value=0. The process then proceeds to step S8, which determines whether the repetition value dropped below the threshold. If the programmer sets the threshold as 1, the answer is YES, and then the process continues to step S9 to set the handling message HM1=AB34, initializes the repetition value as 1, and then returns to step S1 to receive a message. There will be no new message displayed on display device 40.

At time T4, the message is received and decoded, resulting in DM1=1234; step S3 then determines that DM1 and HM1 are not the same, after which the process goes to step S7 to reduce the repetition value of the handling message HM1 by 1. At this point, the repetition value=0. The process then proceeds to step S8, which determines whether the repetition value is lower than the threshold, and then continues to step S9 to set the handling message HM1=1234; then the process initializes the repetition value to 1.

At time T5, the message is received and decoded, resulting in DM1=1234; then step S3 determines that DM1 and HM1 are the same, which increases the repetition value of the handling message HM1 to 2. If the programmer presets the predefined value as 2, then the handling message can be displayed. After decision step S5, the process continues to step S6 to display a new message onto display device 40.

The abovementioned embodiment is able to improve the accuracy and alleviate problems such as intermingling of word groups. Although the description is simplified by using a four-character word group, the actual number of characters, the predefined value, and the threshold value can be adjusted according to system requirements. For example, the present invention can be applied to eight-character word group, and not limited to four-character word group.

Furthermore, it is possible that the broadcast message comprises more than one word group at a time; several word groups may be sent simultaneously in an alternating manner. Therefore, the present invention provides another embodiment of a message decoding method, which increases the quantity of buffer memory in order to improve the accuracy and the processing speed.

Figure 5:
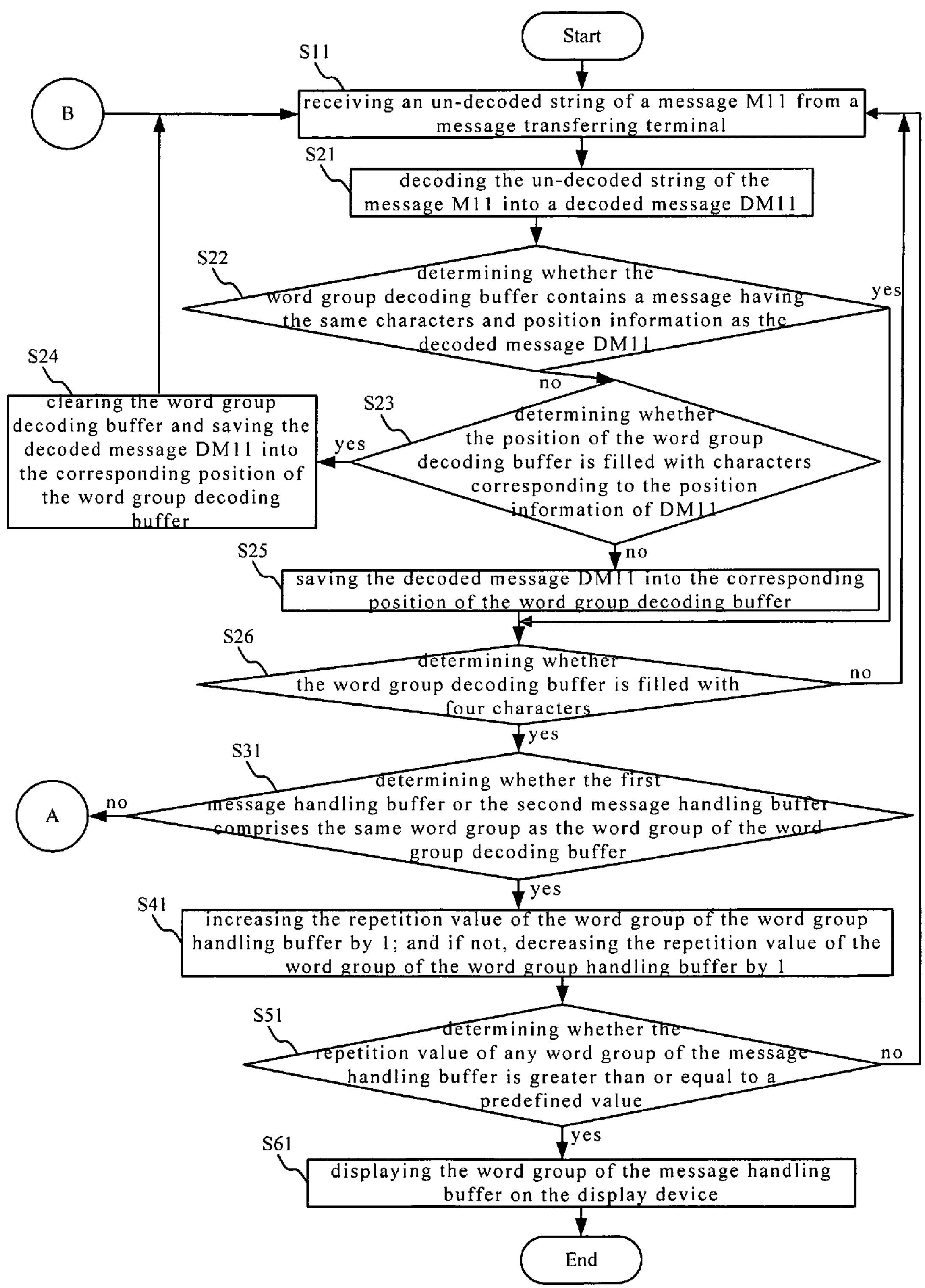
FIG. 5 is a flow chart showing the steps of the message decoding method for the present invention.
Figure 6:
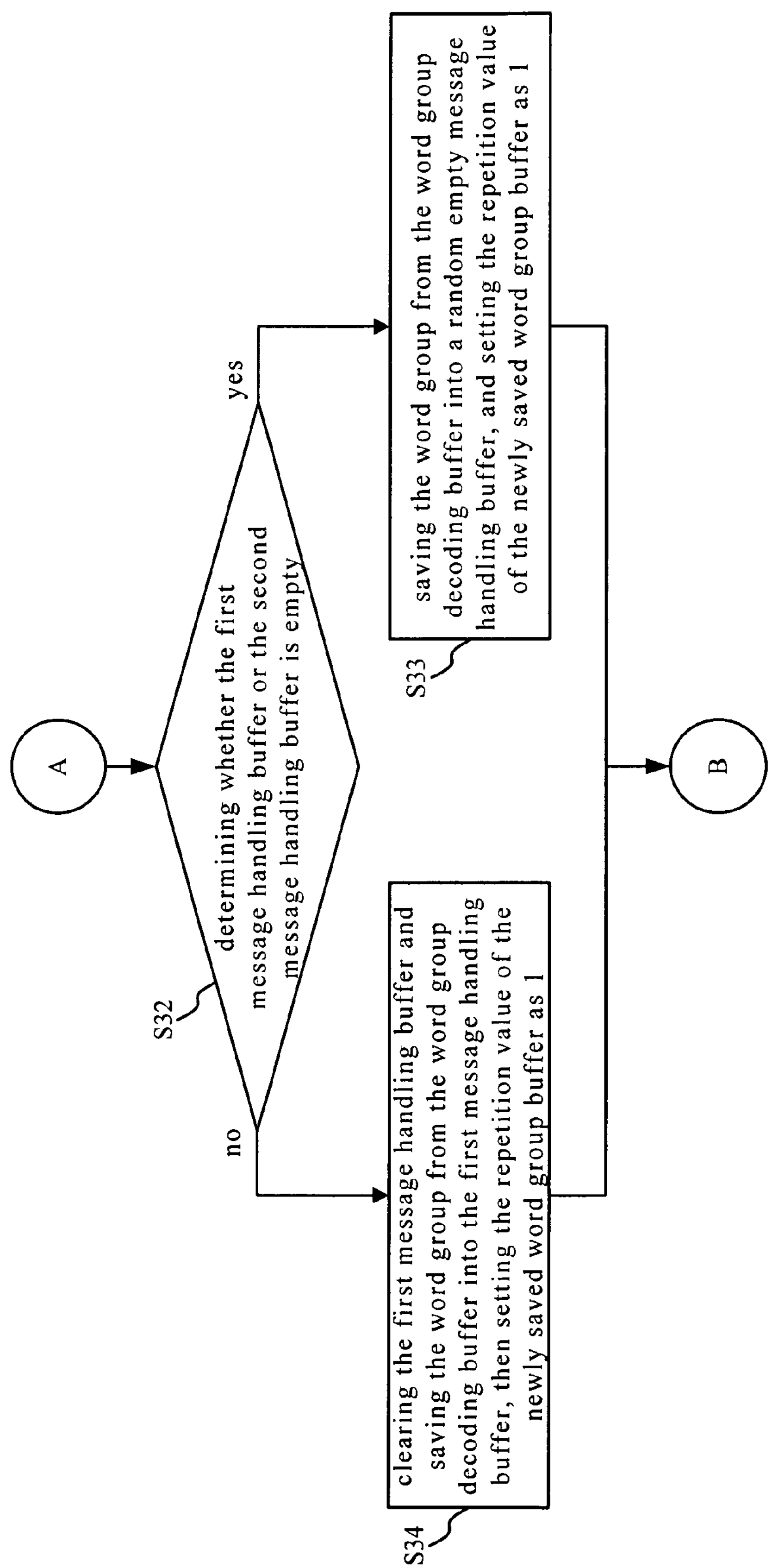
FIG. 6 is a flow chart showing the steps of the message decoding method for an embodiment of the present invention.

FIG. 5 and FIG. 6 show another embodiment of the present invention. At each sampling, the DSP can decode only two characters with one corresponding position; therefore, a storage device 20 is introduced in the embodiment, wherein the storage device 20 comprises a word group decoding buffer, a first message handling buffer, and a second message handling buffer.

Similarly, this embodiment uses a word group of four characters in order to simplify the description. As show in FIG. 5, the process begins with step S11: receiving an un-decoded string of a message M11 from a message transferring terminal, and then proceeds to step S21: decoding the un-decoded string of the message M11 into a decoded message DM11, wherein the decoded message DM11 comprises two characters and one position information.

Step S22 is determining whether the word group decoding buffer contains a message having the same characters and position information as the decoded message DM11; if yes, the process then continues to step S26: determining whether the word group decoding buffer is filled with four characters; if no, the process then proceeds to step S23: determining whether the position of the word group decoding buffer is filled with characters corresponding to the position information of DM11; if yes, the process then proceeds to step S24: clearing the word group decoding buffer and saving the decoded message DM11 into the corresponding position of the word group decoding buffer, and returns to step S11; if no, the process then continues to step S25: saving the decoded message DM11 into the corresponding position of the word group decoding buffer, and then proceeds to step S26: determining whether the word group decoding buffer is filled with four characters; if no, then proceeds to step S11; if yes, the process then proceeds to step S31: determining whether the first message handling buffer or the second message handling buffer comprises the same word group as the word group of the word group decoding buffer.

As shown in FIG. 6, after step S31 determines that there are no matching word groups, the process then proceeds to step S32: determining whether the first message handling buffer or the second message handling buffer is empty. If yes, the process continues to step S33: saving the word group from the word group decoding buffer into a random empty message handling buffer, and setting the repetition value of the latest saved word group buffer as 1, and then returns to step S11. If no, the process proceeds to step S34: clearing the first message handling buffer and saving the word group from the word group decoding buffer into the first message handling buffer, then setting the repetition value of the latest saved word group buffer as 1, and then returning to step S11.

The reason that the first message handling buffer is cleared in step S34 is that a new set of word group needs to be saved, but there are no available spaces because the buffer areas are already filled; thus, one of the message handling buffers needs to be dispatched. In the present invention, the word group of the first message handling buffer is designated to be deleted so that a new word group can be saved. However, the priority in choosing which message handling buffer is to be deleted can be designed by the user or the programmer. For example, one can delete a message handling buffer with a lower word group repetition value. In addition, if the word group repetition values of the message handling buffers are the same, then the priority can be determined by the following methods: assigning a particular message handling buffer to be deleted (such as the first message handling buffer); deleting one message handling buffer at random; first in first out (FIFO): deleting the message handling buffer which is saved first; or last in first out (LIFO): deleting the message handling buffer which is saved last.

Step S31 is determining whether the first message handling buffer or the second message handling buffer comprises of the same word group as the word group of the word group decoding buffer. If yes, the process then proceeds to step S41: increasing the repetition value of the word group of the word group handling buffer by 1 when the word group of the word group handling buffer is the same as the word group of the word group decoding buffer; and decreasing the repetition value of the word group of the word group handling buffer by 1 when the word group of the word group handling buffer is not the same as the word group of the word group decoding buffer. The method could further comprise a step of: determining whether the repetition value of the word group of the word group handling buffer is equal to or lower than a threshold; if yes, deleting the word group in order to decrease the buffer space.

Next the process proceeds to step S51, determining whether the repetition value of any word group of the message handling buffer is greater than or equal to a predefined value; if no, it then returns to step S11; and if yes, it then proceeds to step S61: displaying the word group of the message handling buffer on the display device 40, wherein the repetition value of the word group is greater than or equal to the predefined value.

The repetition value is obtained by repeating the above-mentioned message receiving procedures a few times; this can be used for determining the message consistency and decreases the probability of displaying incorrect messages. The predefined value can be set in conjunction with the sampling rate. Increasing the predefined value will improve the accuracy of the message displayed, but it will also prolong the duration of the decoding process before the message is displayed. The quantity of the message handling buffer is not restricted to the quantity as shown in the present embodiment; the settings of the predefined value are related to the sampling rate of the DSP and also to the quantity of the message handling buffer. For example, pairing a low sampling rate DSP with a plurality of message handling buffers may have the same effect as pairing a high sampling rate DSP with fewer message handling buffers. Furthermore, the predefined value can be decreased when the quantity of the message handling buffers increases.

FIG. 7 is a table showing the time and the status of the display device 40 in accordance with the steps in FIG. 5 and FIG. 6. In this embodiment, each word group comprises four characters; at each sampling, the DSP is able to decode two characters with one corresponding position (thus there are only two positions in this embodiment); the string will be updated and the word group will be displayed on the display device 40. If, for example, the broadcast system sends out two messages ABCD and 1234 respectively, then in step S21, two characters are decoded by the DSP with one corresponding position; the message is decoded at time T1 such that the decoded message DM11=AB is located at position one.

Assuming that the system is decoding for the first time and that the word group decoding buffer is empty, then the determination of step S22 is no and the process proceeds to step S23. If the determination of step S23 is no, then the process proceeds to step S25, saving the decoded message DM11 into position one of the word group decoding buffer.

Next the process proceeds to step S26. If it determines that the word group decoding buffer is not completely filled with four characters, the process returns to step S11 to receive a message.

At time T2, the message is received and decoded, resulting in DM11=CD being located at position two, and the process then proceeds to step S22. If the word group decoding buffer already comprises the characters AB at position one, then the determination of step S22 is no; therefore, it proceeds to decision step S23. If the determination of step S23 is no, the process continues to step S25, saving the decoded message DM11 into position two of the word group decoding buffer.

At step S26; the word group decoding buffer is now filled with four characters, and the process therefore proceeds to step S31.

Next, assume that the system is used for the first time, so there are no pre-stored values in the message handling buffer; thus, the determination of step S31 is no, and the determination of step S32 is yes. The process then continues to step S33, saving the word group of the word group decoding buffer into one of the empty word group handling buffers. If there are several empty word group handling buffers, the priority in selecting which word group handling buffer to fill can be designed according to a programmer's requirements. In this embodiment, assume that the priority is designed according to the buffer sequence, the first word group handling buffer is filled with the decoded word group ABCD and the first repetition value is set as 1.

At time T3, the message is received and decoded, resulting in DM11=AB being located at position one. Next, the process proceeds to step S22; if the word group decoding buffer already comprises characters AB at position one, then the decision produced by step S22 is YES; therefore, it proceeds to decision step S26. Next, the word group decoding buffers are completely filled with four characters, and the process then proceeds to step S31.

Next, the determination of step S31 is that the first word group handling buffer and the word group decoding buffer are the same; therefore, the process proceeds to step S41, increasing the repetition value of the first word group buffer by 1, whereby it becomes 2.

Next, the process proceeds to the decision step S51. Assume that the predefined value is 2; then at step S61, the word group ABCD is shown on the display device 40.

At time T4, the message is received and decoded, resulting in DM11=12 being located at position one. Next, the process proceeds to step S22. If the word group decoding buffer already comprises characters AB at position one, and the determination of step S22 is no, then the process proceeds to decision step S23. If the determination of step S23 is yes, then the process proceeds to step S24, clearing the word group decoding buffer and saving the characters 12 into position one of the word group decoding buffer.

At time T5, the message is received and decoded, resulting in DM11=34 being located at position two. Next, the process proceeds to step S22; if the word group decoding buffer already comprises the characters 12 at position one, then the determination of step S22 is no. Next, the process proceeds to decision step S23, in which the determination of step S23 is no; and the process then proceeds to step S25, saving the decoded message DM11 into position two of the word group decoding buffer.

Next, the process proceeds to step S26, and because the word group decoding buffer is filled with four characters, it continues to step S31. The first word group handling buffer comprises the characters ABCD and the second word group handling buffer is empty; therefore, the determination of step S31 is no. Next, if the determination of step S32 is yes, it then continues to step S33, saving the characters 1234 of the word group decoding buffer into the second word group handling buffer and setting the second repetition value as 1.

At time T6, the message is received and decoded, resulting in DM11=12 being located at position one. Next, the process proceeds to step S22; if the word group decoding buffer already comprises the characters 12 at position one, then the determination of step S22 is yes, and the process continues to step S26. Because the word group decoding buffer is filled with four characters, the process then proceeds to step S31.

Next, the determination of step S31 is that the second word group handling buffer and the word group decoding buffer are the same; the process therefore proceeds to step S41, which increases the repetition value of the second word group buffer by 1, whereby it becomes 2, and decreases the repetition value of the first word group buffer by 1, so it becomes 0.

The process then proceeds to step S51; if yes, then the process proceeds to step S61, and the characters 1234 in the word group will be shown on the display device 40.

The abovementioned embodiment is able to improve the accuracy and alleviate the problem of mingling of the word groups. Although the description is simplified by using a word group with four characters, the actual number of characters, the predefined value, and the threshold value can be adjusted according to system requirements.

Take note that knowledgeable users with experience in this field can alter the sequence of the above steps or execute some of the steps simultaneously to achieve the same result.

Although the present invention has been explained in relation to its preferred embodiment, it is also of vital importance to acknowledge that many other possible modifications and variations can be made without departing from the spirit and scope of the invention as hereinafter claimed.

What is claimed is:

1. A message decoding method for an electronic system capable of displaying messages, the electronic system comprising a processing module, a storage module and a receiving module, wherein the processing module is electrically connected to the storage module and to the receiving module, wherein the receiving module is used for receiving an un-decoded string of a message from a message transferring terminal, wherein the processing module is used for decoding and compiling the message received by the receiving module, wherein the message decoding method comprises:

the processing module decoding the un-decoded string of the message received from the message transferring terminal, acquiring a first word group and saving the first word group to a word group handling buffer of the storage module, and recording a repetition value of the first word group;

the processing module decoding an un-decoded string of the message received from the message transferring terminal, acquiring a second word group from the un-decoded string, and saving the second word group to a word group decoding buffer of the storage module;

the processing module comparing the first word group and the second word group to determine whether the first word group and the second word group are the same; and increasing the repetition value of the first word group when the first word group and the second word group are the same.

2. The message decoding method as claimed in claim 1 further comprising:

the processing module determining whether the repetition value is less than a predefined value; and the processing module controls the electronic system to display the first word group when the repetition value is not less than the predefined value.

3. The message decoding method as claimed in claim 1 further comprising:

determining whether the first word group and the second word group are the same; and decreasing the repetition value of the first word group when the first word group and the second word group are not the same.

4. The message decoding method as claimed in claim 1 further comprising:

the processing module determining whether the repetition value is greater than a threshold; and the processing module deleting the first word group from the word group handling buffer when the repetition value is not greater than the threshold.

5. The message decoding method as claimed in claim 4 further comprising:

saving the second word group to the word group handling buffer, and defining a repetition value of the second word group as an initial value.

6. The message decoding method as claimed in claim 1 further comprising:

the processing module decoding the second message and acquiring a plurality of characters and a plurality of position information corresponding to each of the characters; and saving each of the characters into the corresponding positions of the word group decoding buffer.

7. The message decoding method as claimed in claim 1 further comprising:

the processing module determining whether the word group decoding buffer is full; and comparing the first word group and the second word group to determine whether the first word group and the second word group are the same when the word group decoding buffer is filled with the second word group.

8. The message decoding method as claimed in claim 6 further comprising:

the processing module decoding the second message and acquiring a plurality of characters, wherein the plurality of characters are different and each of the characters has the same position information, and the corresponding position of the word group decoding buffer is saved with the latest obtained characters.

9. The message decoding method as claimed in claim 6 further comprising:

the processing module decoding the second message and acquiring a plurality of characters, wherein the plurality of characters are different and each of the characters has the same position information, and clearing the word group decoding buffer.

10. The message decoding method as claimed in claim 6 further comprises:

the processing module decoding the second message and acquiring a plurality of characters, wherein the plurality of characters are identical and each of the characters has the same position information, and the processing module determines whether the word group decoding buffer is full.

11. A message decoding method for an electronic system capable of displaying messages, the electronic system comprising a processing module, a storage module, and a receiving module, wherein the processing module is electrically connected to the storage module and to the receiving module, the receiving module is used for receiving an un-decoded string of a message from a message transferring terminal, the processing module is used for decoding and compiling the message received by the receiving module, and the message decoding method comprises:

the processing module decoding an un-decoded string of a message received from the message transferring terminal, acquiring a plurality of characters and a plurality of position information corresponding to each of the characters, and saving the characters into the corresponding positions of a word group decoding buffer of the storage module;

when the word group decoding buffer is full, the processing module determining whether the word group of the word group decoding buffer is the same as one of the word group of the word group handling buffer of the storage module; and increasing the repetition value of the first buffer word group when the processing module determines that the word group in the word group decoding buffer is the same as a the first buffer word group in the word group handling buffer.

12. The message decoding method as claimed in claim 11, further comprising:

the process module determining whether the repetition value of the first word group buffer is less than a predefined value; and the processing module controlling the electronic system to display the first buffer word group when the repetition value of the first word group buffer is not less than the predefined value.

13. The message decoding method as claimed in claim 11, further comprising:

decreasing the repetition value of the word group of the word group handling buffer when the word group of the word group handling buffer and the word group of the word group decoding buffer are different.

14. The message decoding method as claimed in claim 11, further comprising the following steps of:

the processing module determining whether the repetition value of each of these word groups of the word group handling buffer is greater than a threshold; and the processing module deleting the word group having a repetition value less than the threshold from the word group handling buffer when the repetition value of any of these word groups of the word group handling buffer is not greater than a threshold.

15. The message decoding method as claimed in claim 11, further comprising:

when the processing module determines that the word groups of the word group handling buffer are not identical to the word groups of the word group decoding buffer, then saving the word groups of the word group decoding buffer into the word group handling buffer, and setting the repetition value of the word group as an initial value.

16. The message decoding method as claimed in claim 15, further comprising:

when the processing module determines that the word groups of the word group handling buffer are not identical to the word groups of the word group decoding buffer, and the word group handling buffer is full, then deleting at least one word group from the word group handling buffer; and saving the word groups of the word group decoding buffer into the word group handling buffer, and setting the repetition value of the word group as an initial value.

* * * * *